(12) United States Patent  
Yamane et al.

(10) Patent No.: US 6,650,024 B2
(45) Date of Patent: Nov. 18, 2003

(54) VEHICLE POWER DISTRIBUTOR AND METHOD OF PRODUCING THE SAME

(75) Inventors: Shigeki Yamane, Nagoya (JP); Isao Isshiki, Nagoya (JP)

(73) Assignees: Autonetworks Technologies, LTD, Nagoya (JP); Sumitomo Wiring Systems, LTD, Mie (JP); Sumitomo Electric Industries, LTD, Osaka (JP)

( * ) Notice: Subject to any disclaimer, the term of this patent is extended or adjusted under 35 U.S.C. 154(b) by 164 days.

(21) Appl. No.: 09/908,567

(22) Filed: Jul. 20, 2001

(65) Prior Publication Data

US 2002/0021048 A1 Feb. 21, 2002

(30) Foreign Application Priority Data

Aug. 2, 2000 (JP) ......................................... 2000-233996

(51) Int. Cl.[7] .................................................. B60L 1/00
(52) U.S. Cl. .................................... 307/10.1; 174/72 B
(58) Field of Search ........................ 307/10.1; 174/72 B, 174/68.2

(56) References Cited

U.S. PATENT DOCUMENTS 5,359,761 A * 11/1994 Whitson et al. ............... 29/883
5,643,693 A *  7/1997 Hill et al. ...................... 429/121
5,823,819 A * 10/1998 Kondo et al. .................. 439/487
5,973,409 A * 10/1999 Neibecker et al. ........... 307/10.1
5,995,374 A    11/1999 Suzuki et al.
6,026,773 A *  2/2000 LaBelle ....................... 123/179.3
6,178,106 B1 *  1/2001 Umemoto et al. ............ 363/146
6,295,201 B1 *  9/2001 Ogden et al. ................. 361/704

FOREIGN PATENT DOCUMENTS

| JP | A 8-116179  | 5/1996  |
| JP | A 9-266382  | 10/1997 |
| JP | A 10-243526 | 9/1998  |
| JP | A 10-303230 | 11/1998 |
| JP | A 11-346042 | 12/1999 |

* cited by examiner

Primary Examiner—Gregory J. Toatley, Jr.
Assistant Examiner—Sharon A. Polk
(74) Attorney, Agent, or Firm—Oliff & Berridge, PLC (57) ABSTRACT

A power distributor having: a bus bar aggregation B made out of a single plate material; semiconductor switching devices 14 mounted on the bus bar aggregation B; and a housing 22 made out of an electrical insulating material such as resin or the like and molded around the device-containing bus bar aggregation B.

Amethod of manufacturing the power distributor is constituted by the steps of: forming the bus bar aggregation B; molding the housing 22 around the bus bar aggregation B after the semiconductor switching devices 14 are mounted on the bus bar aggregation B; and completing a power distribution circuit after cutting off suitable portions of the bus bar aggregation B after the molding.

13 Claims, 10 Drawing Sheets

VEHICLE POWER DISTRIBUTOR AND METHOD OF PRODUCING THE SAME

BACKGROUND OF THE INVENTION

1. Field of Invention

The present invention relates to a power distributor to be mounted on a vehicle, and a method for producing the power distributor.

2. Description of Related Art

An electric connection box or the like having fuses and relay switches incorporated in a power distribution circuit constituted by a laminate of a plurality of bus bar boards is generally known as a power distributor for distributing electric power given from an on-vehicle power supply into a plurality of on-vehicle loads.

In order to achieve reduction in size of the electric connection box and highspeed switching control, development of a power distributor using semiconductor switching devices such as FETs, instead of the aforementioned relay switches, interposed between input and output terminals has been further advanced in recent years. For example, JP-A-10126963 discloses a power distributor using a plurality of semiconductor switching devices having drain terminals which are connected to a metal plate connected in turn to a power supply input terminal, source terminals connected to power supply output terminals respectively and gate terminals connected to a control circuit board.

The power distributor disclosed in JP-A-10-126963 is superior to the background-art electric connection box in that reduction in size is advanced by introduction of semiconductor switching devices. The power distributor disclosed in JP-A-10-126963, however, must have an input terminal for introducing a large current and a large number of output terminals for distributing electric power into electronic units and must further have a control circuit board for controlling the semiconductor switching devices. Hence, it is difficult to reduce the size greatly. Particularly there is a large problem in reduction in thickness.

When the power distributor is to be mounted on a vehicle, there is another important problem to be solved. That is, the state of connection between each semiconductor switching device and the metal plate can be held steadily by a simple structure so that vibration at the time of running of the vehicle does not easily cause disconnection of each semiconductor switching device from the metal plate.

On the other hand, in production process, there is a possibility that a resin housing may be partially melted by heat due to soldering or the like performed for mounting the semiconductor switching devices on the metal plate after the metal plate constituting a power distribution circuit is incorporated in the resin housing. In order to avoid such melting of the housing, if the metal plate is incorporated in the housing after the semiconductor switching devices are mounted on the metal plate, the work of incorporating the metal plate in the housing is difficult. Hence, in any case, the assembling work is not easy and the mass-production characteristic is poor.

SUMMARY OF THE INVENTION

The present invention is devised upon such circumstances and an object of the invention is to provide a vehicle power distributor in which good power distribution on a vehicle can be performed in a simple and thin structure, and to provide a method of producing the power distributor by simple steps.

In order to solve the above problems, according to the present invention, there is provided a method of producing a vehicle power distributor which is to be mounted on a vehicle for distributing electric power from a common power supply into a plurality of electric loads and which uses semiconductor switching devices interposed between the power supply and the loads for switching on/off current conduction thereof, comprising the steps of: forming a bus bar aggregation containing an input terminal portion connected to the power supply, a device mount portion connected to the input terminal portion and having the semiconductor switching devices mounted on the device mount portion in the condition that a power supply side current-conduction terminal of each semiconductor switching device is connected to the device mount portion, and a plurality of output terminal portions to which load side current-conduction terminals of the semiconductor switching devices are connected respectively, the input terminal, the device mount portions and the output terminal portions being integrated with one another; mounting the semiconductor switching devices on the device mount portion by connecting power supply side current-conduction terminals of the semiconductor switching devices to the device mount portion of the bus bar aggregation and connecting the load side current-conduction terminals of the semiconductor switching devices to the output terminal portions respectively; molding a housing from an electrically insulating material around the device-containing bus bar aggregation produced by the mounting step so that at least the input terminal portion and the output terminal portions are partially exposed; and cutting joint portions between a plurality of terminal portions inclusive of the input terminal portion and the output terminal portions after the molding step (Aspect 1).

Further, according to the present invention, there is provided a vehicle power distributor which is to be mounted on a vehicle for distributing electric power from a common power supply into a plurality of electric loads and which uses semiconductor switching devices interposed between the power supply and the loads for switching on/off current conduction thereof, comprising: a bus bar aggregation including an input terminal portion connected to the power supply, a device mount portion connected to the input terminal portion and having the semiconductor switching devices mounted on the device mount portion in the condition that power supply side current-conduction terminals of the semiconductor switching devices are connected to the device mount portion, and a plurality of output terminal portions to which load side current-conduction terminals of the semiconductor switching devices are connected; and a housing molded from an electrically insulating material around the device-containing bus bar aggregation so that at least the input terminal portion and the output terminal portions are partially exposed in the condition that the plurality of semiconductor switching devices are mounted on the device mount portion of the bus bar aggregation (Aspect 5).

Because the power distributor according to the present invention has a structure in which semiconductor switching devices are mounted on a bus bar aggregation constituted by a single metal plate and in which a housing is molded around the bus bar aggregation provided with the semiconductor switching devices, this power distributor is smaller in size and thickness than the background-art power distributor and the state of connection between the bus bar aggregation and each semiconductor switching device is held steadily by the housing molded around the bus bar aggregation provided with the semiconductor switching devices. Moreover, the power distributor can be produced by the simple steps of: mounting the semiconductor switching devices on the bus bar aggregation; molding the housing around the bus bar aggregation provided with the semiconductor switching devices; and cutting off suitable conductor portions.

The step of forming the bus bar aggregation can be performed, for example, by punching out the bus bar aggregation from a single metal plate (Aspect 2) so that massproduction characteristic can be more improved.

Further, a heat-radiating member is attached to the housing formed by the molding step so that the heat-radiating member is exposed to the outside of the housing in a state in which heat can be transmitted between the heat-radiating member and the device mount portion (Aspect 3 or 6). Accordingly, heat generated from the semiconductor switching devices partly or wholly embedded in the housing can be effectively released to the outside of the housing.

Further, if a window through which joint portions between the plurality of terminal portions are exposed is formed in the housing in the molding step, and the joint portions are cut off through the window in the cutting step (Aspect 4), the joint portions can be cut off easily without any inconvenience after the molding step even in the case where the joint portions are provided, for example, in intermediate portions of the bus bar aggregation.

Further, according to the present invention, there is provided a bus bar aggregation for forming a vehicle power distributor which is to be mounted on a vehicle for distributing electric power from a common power supply into a plurality of electric loads and which uses semiconductor switching devices interposed between the power supply and the loads for switching on/off current conduction thereof, comprising: an input terminal portion connected to the power supply; a device mount portion connected to the input terminal portion and having the semiconductor switching devices mounted on the device mount portion in the condition that power supply side current-conduction terminals of the semiconductor switching devices are connected to the device mount portion; and a plurality of output terminal portions to which load side current-conduction terminals of the semiconductor switching devices are connected, wherein the bus bar aggregation is made from a single metal plate, and wherein the input terminal portion, the device mount portion and the output terminal portions are integrated with one another (Aspect 7).

If the bus bar aggregation is used, it is possible to easily produce a devicecontaining bus bar aggregation for a power distributor, wherein the plurality of semiconductor switching devices are mounted on the device mount portion, the power supply side current-conduction terminals of the semiconductor switching devices are connected to the device mount portion, and the load side current-conduction terminals of the semiconductor switching devices are connected to the output terminal portions respectively (Aspect 9). According to the bus bar aggregation provided with the devices, the aforementioned small-size thin power distributor can be obtained by the simple steps of: molding the housing around the bus bar aggregation; and cutting off suitable portions.

Here, the shape and arrangement of each portion in the bus bar aggregation can be set suitably. For example, preferably, the configuration is made so that the device mount portion extends in a direction of the arrangement of the semiconductor switching devices, the input terminal portion and the output terminal portions extend in a direction approximately perpendicular to the direction of the length of the device mount portion and are arranged at intervals in a direction approximately parallel with the direction of the length of the device mount portion, and end portions of the input terminal portion and output terminal portions opposite to the device mount portion are connected to one another by a connection belt extending approximately in parallel with the device mount portion. According to this configuration, the respective portions can be integrated with one another in a compact layout in which the device mount portion and the connection belt are disposed in lengthwise opposite sides of the input terminal portion and output terminal portions arranged unidirectionally.

DETAILED DESCRIPTION OF PREFERRED EMBODIMENTS

Figure 9:
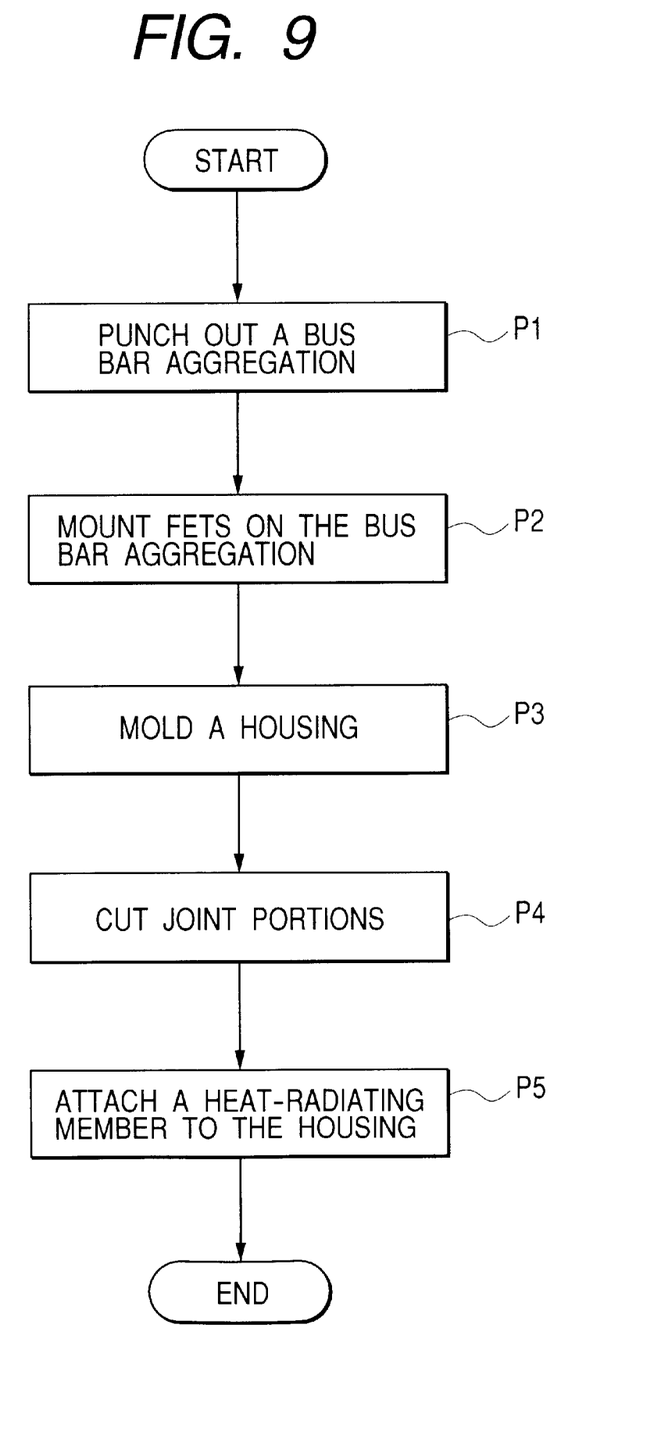
FIG. 9 is a flow chart showing a process of producing the power distributor.

A preferred embodiment of the production method according to the present invention will be described with reference to FIGS. 1 through 8 which are production diagrams and FIG. 9 which is a flow chart.

1) Step P1 of Punching AGGREGATION

Figure 1:
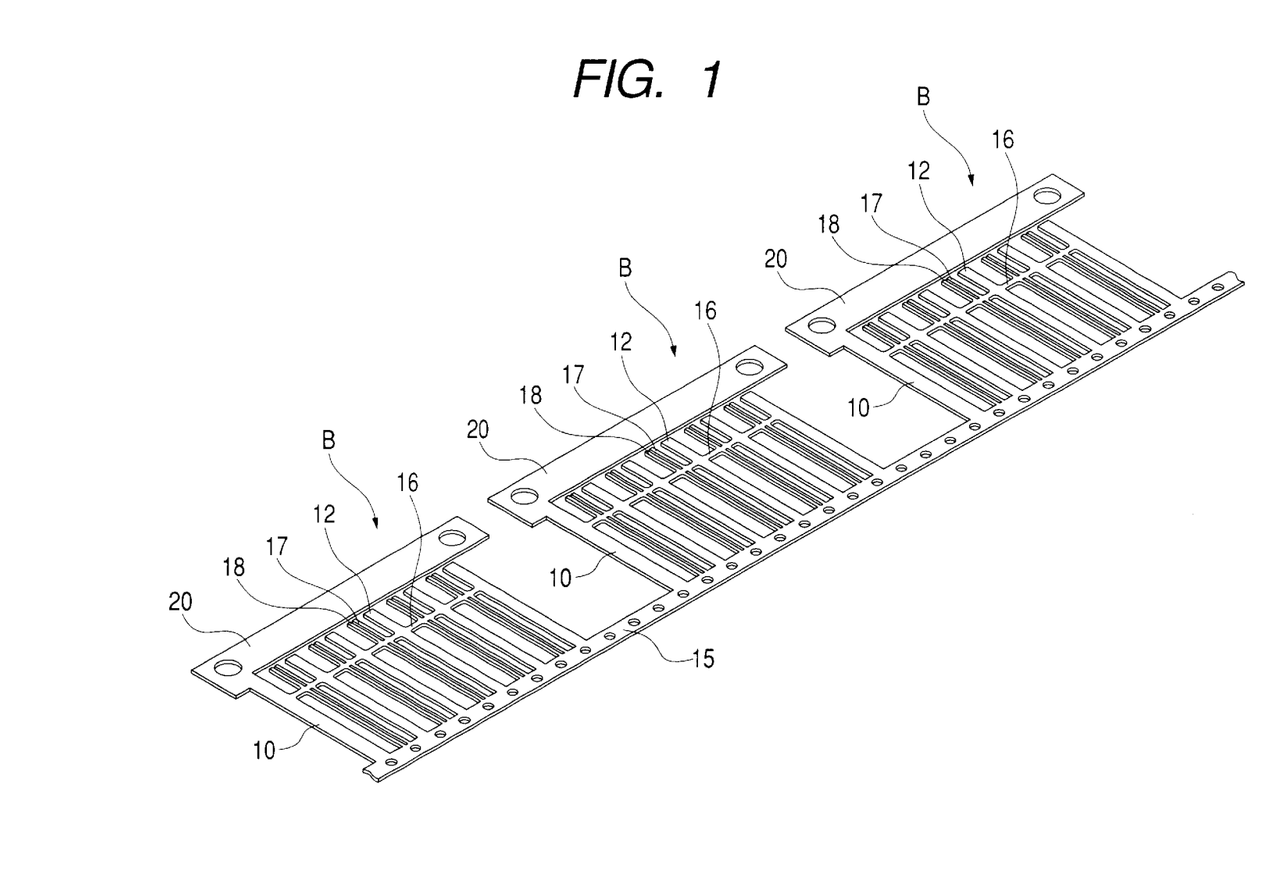
FIG. 1 is a perspective view of bus bar aggregations according to an embodiment of the present invention.

First, a metal plate excellent in electrically conducting characteristic is punched out by pressing or the like to thereby produce an aggregation of a plurality of bus bars B as shown in FIG. 1 at once.

Each of the bus bar aggregations B shown in FIG. 1 has a single input terminal portion 10, a plurality of (for example, five in FIG. 1) output terminal portions 12, and pairs of signal terminal portions 17 and earth terminal portions 18 arranged near by the output terminal portions respectively so as to be parallel with the output terminal portions. Each of these terminal portions is shaped like a strip of paper. These terminal portions are arranged in parallel with one another at intervals. An FET mount portion (device mount portion) 20 extends just near by one end portion of each of these terminal portions and in a direction perpendicular to the direction of the length of these terminal portions (that is, approximately in parallel with the direction of the arrangement of these terminal portions). One end portion of the FET mount portion 20 is connected to an end portion of the input terminal portion 10 so that the FET mount portion 20 is integrated with the input terminal portion 10.

End portions of the terminal portions 10, 12 and 17 opposite to the FET mount portion 20 are connected to one another by a connection belt 15 extending in the direction of the arrangement of the terminal portions (that is, extending approximately in parallel with the FET mount portion 20). The plurality of bus bar aggregations B are also connected to one another by the connection belt 15. That is, in this embodiment, the plurality of bus bar aggregations B integrated with one another by the connection belt 15 are punched out at once from a single metal plate. Lengthwise intermediate portions of the terminal portions are also connected to one another by joint portions 16 which are narrow and approximately parallel with the FET mount portion 20.

Incidentally, in the present invention, such a plurality of bus bar aggregations B need not be punched out from one metal plate. For example, one bus bar aggregation B may be punched out from one metal plate. In either case, the bus bar aggregation is punched out into such a shape that respective terminal portions are integrally connected to one another. In this manner, the necessity of re-arranging the respective terminal portions in predetermined positions is eliminated, so that post-steps are simplified greatly.

2) Step P2 of Mounting FETs

Figure 2:
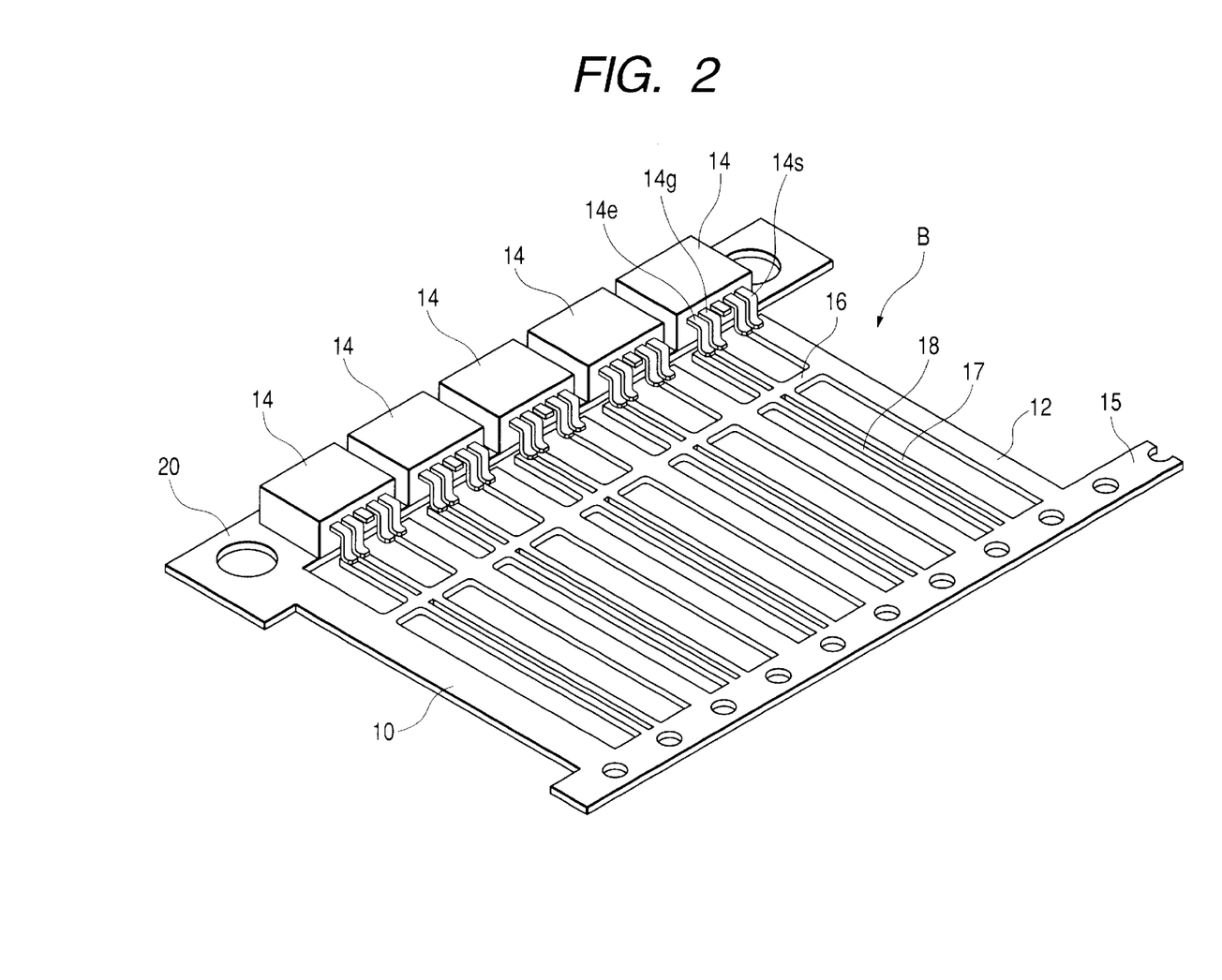
FIG. 2 is a perspective view showing a device-containing bus bar aggregation in which FETs are mounted on a device mount portion of each of the bus bar aggregations depicted in FIG. 1.

As shown in FIG. 2, a plurality of semiconductor switching devices (FETs 14 illustrated in FIG. 2) (of the same number as that of the output terminal portions 12) are mounted on the device mount portion 20 of each bus bar aggregation B. Each of the FETs 14 shown in FIG. 2 has a not shown drain terminal (power supply side connection terminal) disposed on the back surface of the chip body of the FET 14, and a plurality of terminals, including a source terminal 14s (load side connection terminal), a gate terminal 14g and an earth terminal 14e, protruded from one side surface of the chip. Each of the FETs 14 is mounted so that, among the terminals, the drain terminal is connected to the device mount portion 20, the source terminal 14s is connected to an end portion of a corresponding output terminal portion 12, the gate terminal 14g is connected to a corresponding signal terminal portion 17 and the earth terminal 14e is connected to a corresponding earth terminal portion 18. A known means such as soldering can be applied to the connection of the terminals. At this point of time, a resin housing has not been formed yet. Hence, the FETs 14 can be mounted very smoothly because there is no fear that such a resin may be melted by heat owing to the aforementioned soldering or the like.

Incidentally, before or after the step P2 of mounting FETs, intermediate portions of the connection belt 15 are cut off to separate the metal plate into a plurality of bus bar aggregations B.

3) Step P3 of Molding a Housing

Figure 3:
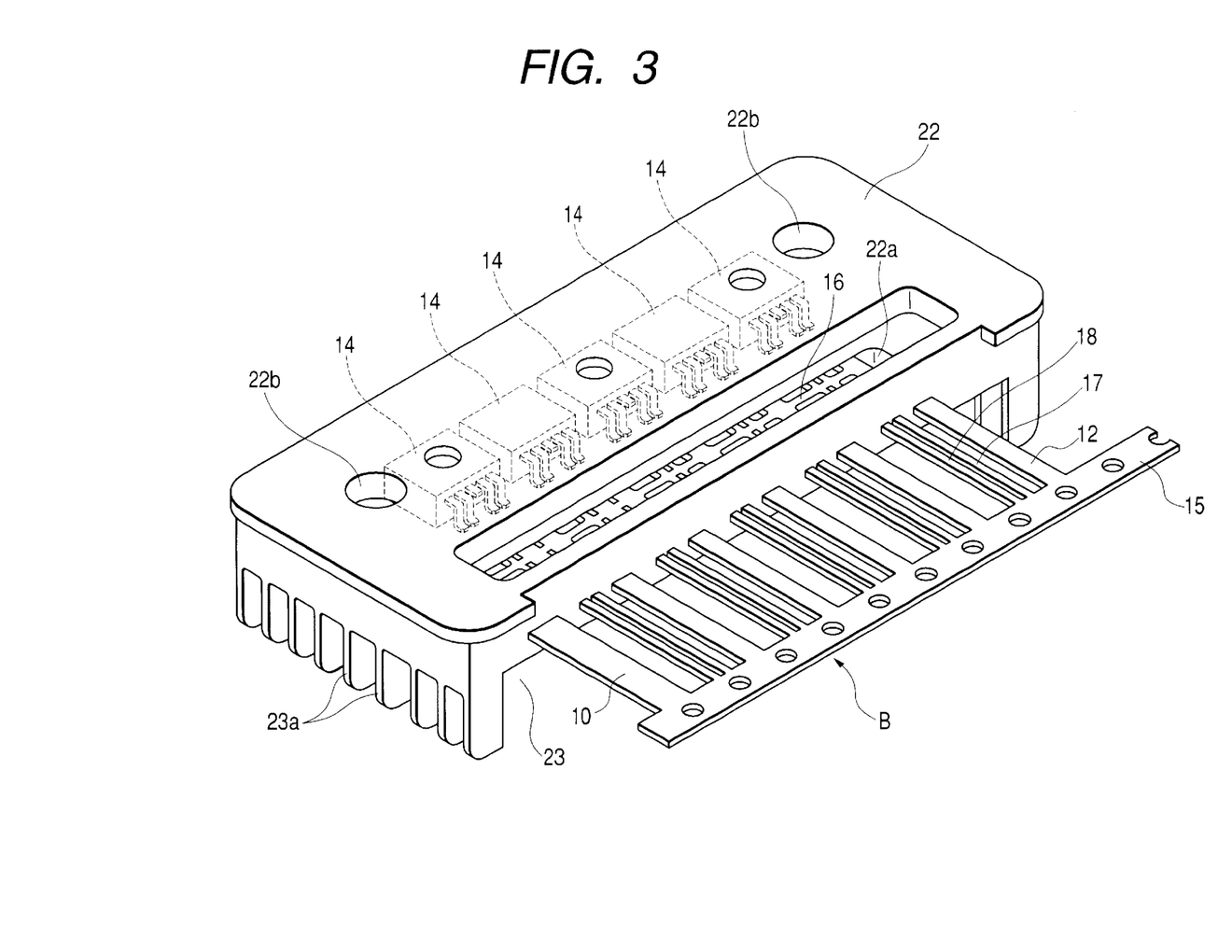
FIG. 3 is a perspective view showing a housing molded around the device-containing bus bar aggregation depicted in FIG. 2.

A housing 22 as shown in FIG. 3 is molded around the device-containing bus bar aggregation produced in the aforementioned mounting step. The housing 22 is made from an electrically insulating material such as a synthetic resin. The housing 22 is shaped so that the whole of the device-containing bus bar aggregation (inclusive of the FETs 14) except the connection belt 15 side end portions of the terminal portions 10, 12, 17 and 18 is covered with the housing 22 from the outside.

However, a window 22a for opening the joint portions 16 between the terminals vertically (that is, for exposing the joint portions 16 to the outside) is formed in the housing 22. Further, a window 22c (FIG. 8) for opening a lower surface of the device mount portion 20 downward is formed in the housing 22 so as to be disposed in the lower side of the device mount portion 20. Further, a heat-radiating member mount concave portion 23 for attaching a heat-radiating member 24 which will be described later to the lower portion of the housing 22 except opposite ends thereof is formed in the lower portion of the housing 22. Fin-like ribs 23a are formed in the opposite ends of the housing 22.

By the molding step, the bus bar aggregation inclusive of the FETs 14 is entirely held by the housing 22, so that the state of connection between each FET 14 and the device mount portion 20 is held more steadily.

4) Step P4 of Removing (Cutting off) the Joint Portions

Figure 4:
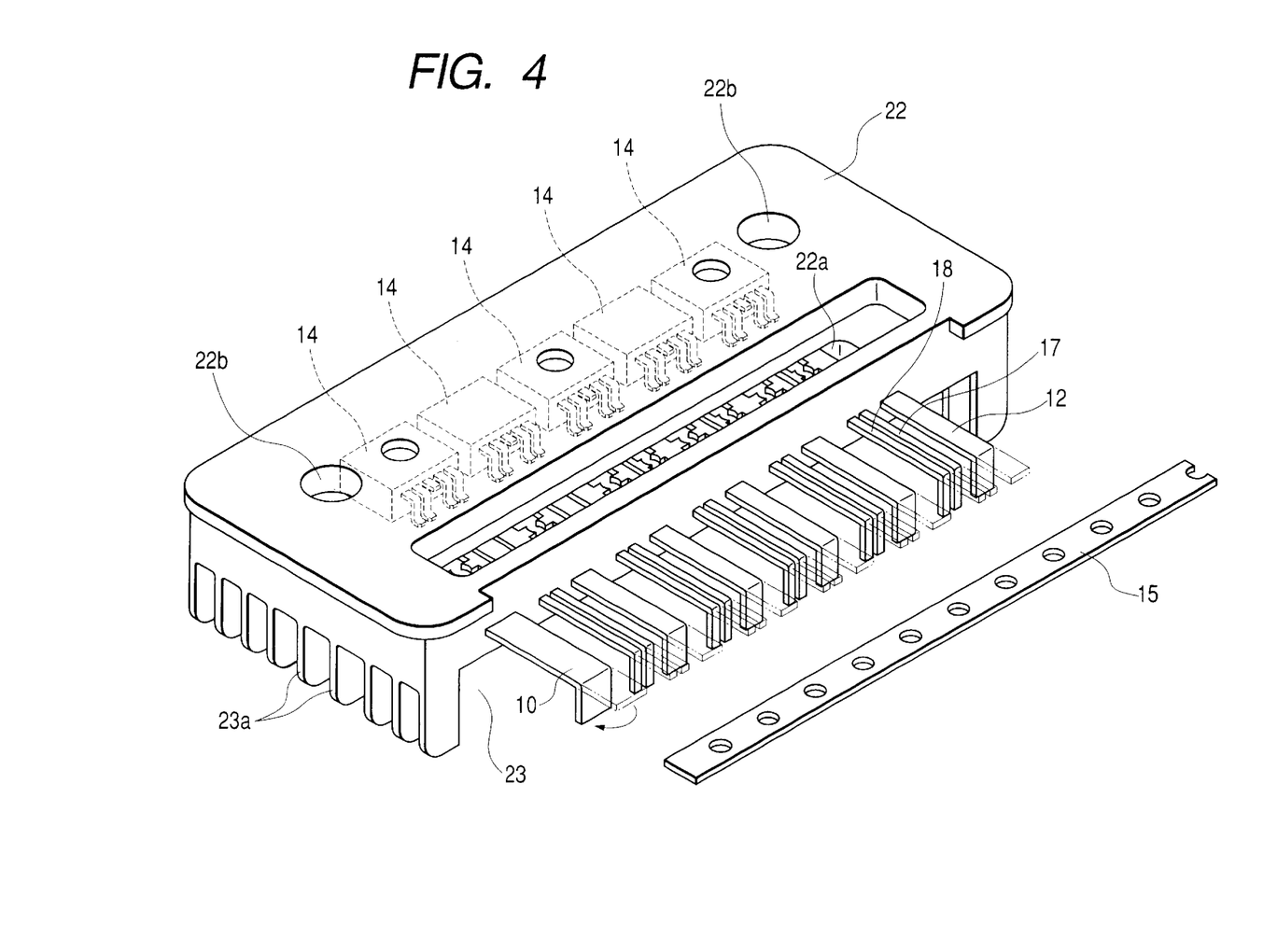
FIG. 4 is a perspective view showing a state in which a cutting step is performed after the step of molding the housing.

After the molding step is completed, as shown in FIG. 4, the connection belt 15 is cut off from the terminal portion portions 10, 12, 17 and 18 and intermediate portions of the joint portions 16 are cut off by pressing or the like through the window 22a formed in the housing 22 to thereby make the terminal portions electrically independent of one another. Thus, a power distribution circuit in which each of semiconductor switching devices such as FETs 14 is interposed between the combination of the input terminal portion 10 and the device mount portion 20 and each output terminal portion 12 is completed. Because the terminal portions are integrally connected to one another before the joint portions are cut off, the labor required for arranging a plurality of terminal-forming metal plates like the background art is eliminated so that the steps up to the molding step can be carried out very smoothly.

Incidentally, in accordance with the mode of connection of the terminal portions 10, 12, 17 and 18 to respective external circuits, forward end portions of the respective terminal portions 10, 12, 17 and 18 may be bent suitably from the positions of the two-dot chain line shown in FIG. 4 to the positions of the solid line shown in FIG. 4, or a connector housing portion capable of being coupled with an external connector may be formed so as to be integrated with the housing 22. In the latter case, the respective terminal portions form connector terminals directly.

5) Step P5 of Attaching a Heat-Radiating Member

Figure 5:
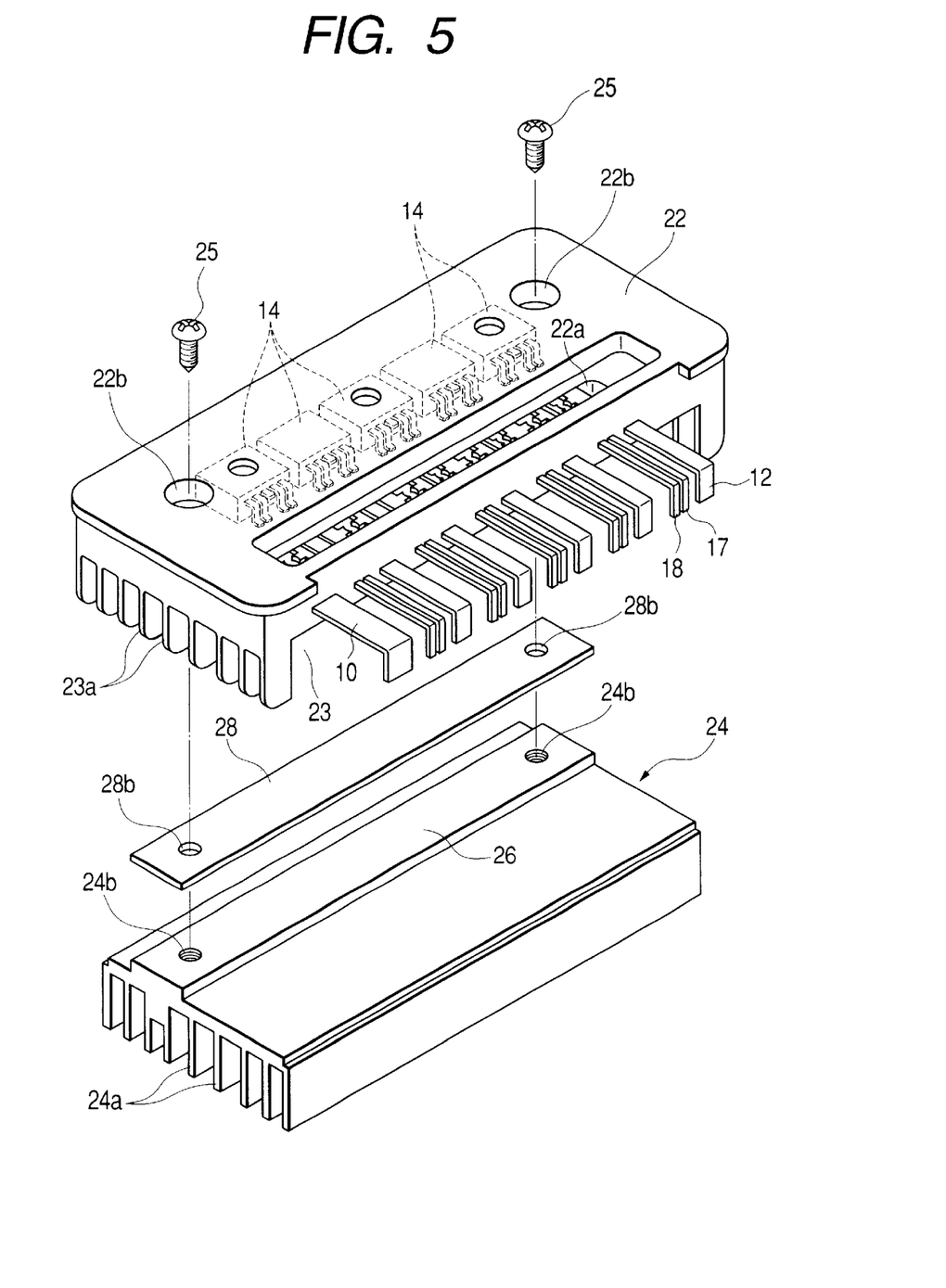
FIG. 5 is a perspective view showing the step of attaching a heat-radiating member to the housing.
Figure 6:
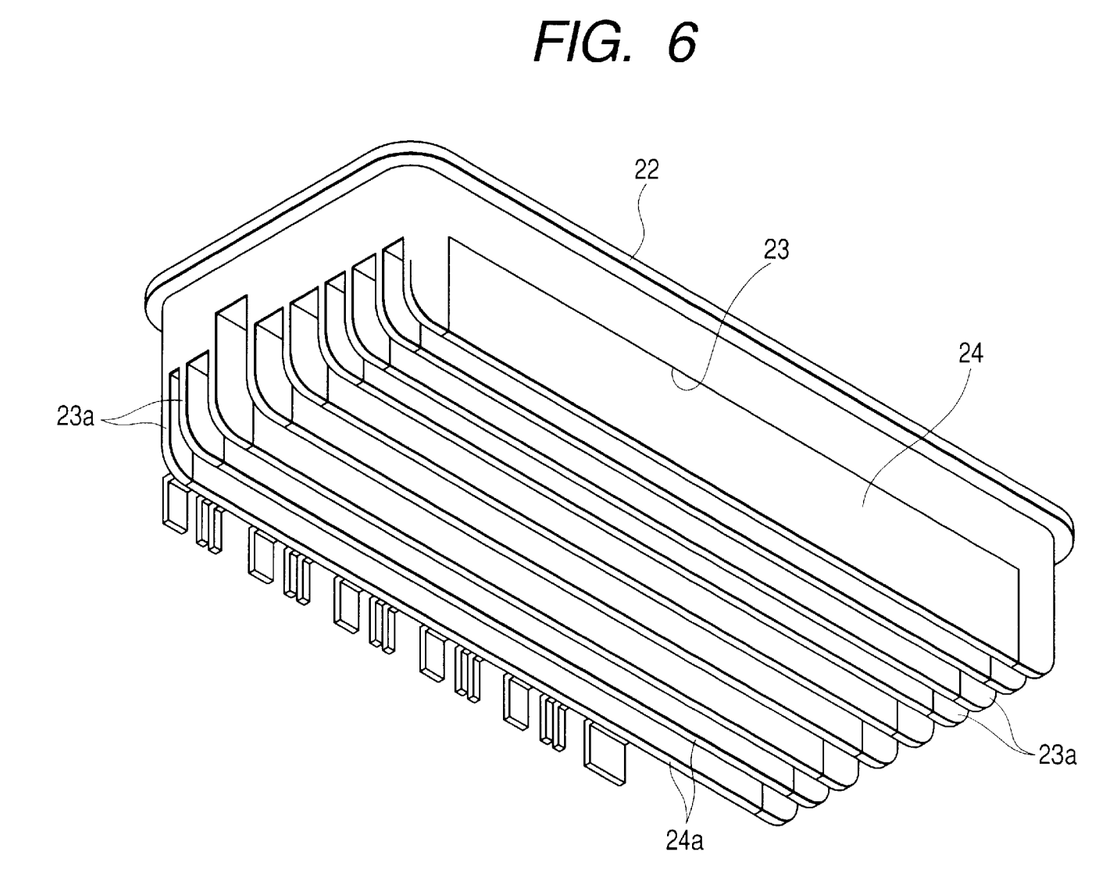
FIG. 6 is a perspective bottom view of a power distributor obtained by attaching the heat-radiating member to the housing.

A heat-radiating member 24 as shown in FIGS. 5 and 6 is attached to the housing 22. The heat-radiating member 24 shown in FIGS. 5 and 6 is wholly integrally made from a high heat-conductive (or high specific heat) material such as aluminum, an aluminum alloy or a copper alloy. A large number of straight-line fins 24a parallel with one another are formed in the lower surface (exposed to the outside of the power distribution portion) of the heat-radiating member 24. The pitch of the fins 24a is matched with that of the ribs 23a so that respective opposite ends of the fins 24a are covered with the fin-like ribs 23a formed on the housing 22 side. A table portion 26 extending in a direction parallel with the direction of the arrangement of the FETs 14 is formed on the upper surface of the heat-radiating member 24 so as to be protruded upward. The table portion 26 is positioned and shaped so that the table portion 26 can enter the window 22c of the housing 22.

The heat-radiating member 24 is fitted into the mount concave portion 23 and bolts 25 are inserted downward through through-holes 22b formed in the housing 22 in advance and are thread-engaged with screw holes 24b formed in the table portion 26 to thereby fix the heat-radiating member 24 to the housing 22. On this occasion, in the window 22c, an electrically insulating sheet 28 made from a high heat-conductive and high electrically insulating material (such as silicone rubber) is interposed between the upper surface of the table portion 26 and the lower surface of the device mount portion 20. Hence, the heat-radiating member 24 and the device mount portion 20 are thermally connected to each other while they are electrically insulated from each other. Hence, even in the case where the FETs 14 are enclosed by the housing 22 as shown in FIG. 5, heat generated from the FETs 14 can be effectively released from the housing through the heat-radiating member 24.

Figure 7:
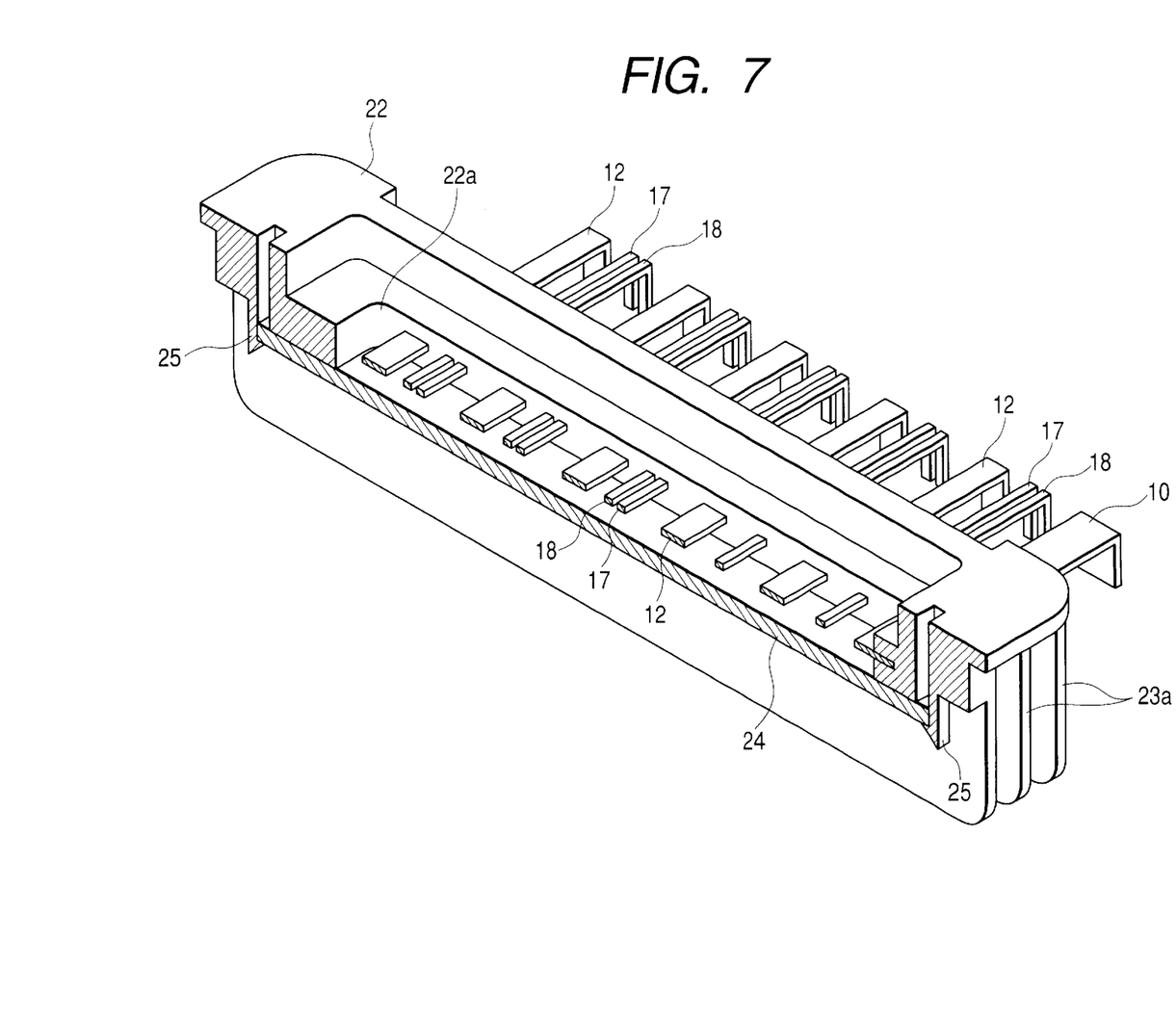
FIG. 7 is a partly sectional perspective view of the power distributor.
Figure 8:
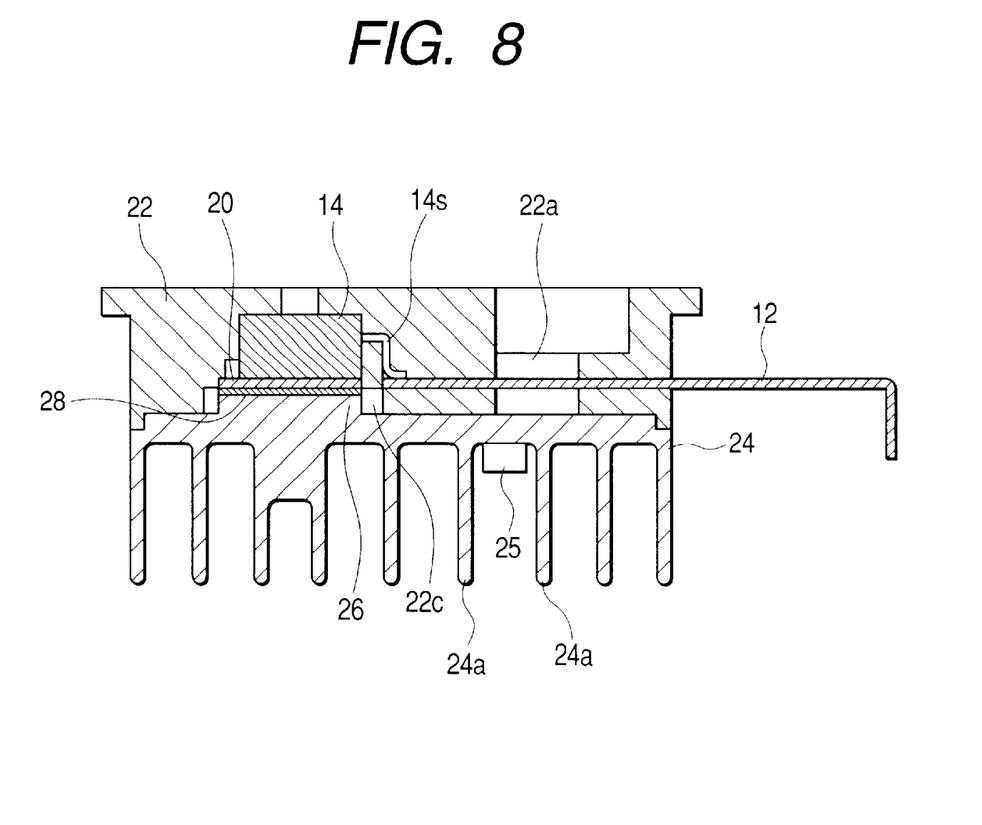
FIG. 8 is a sectional front view of the power distributor.

Incidentally, in the case where the electrically insulating sheet 28 is interposed, for example, bolt insertion holes 28b as shown in FIG. 5 may be formed in suitable positions. If lock pieces 25 for holding a base portion of the heat-radiating member 24 are formed on the housing 22 side so as to be integrated with the housing 22 as shown in FIG. 7, the work of attaching the heat-radiating member 24 to the housing 22 can be made more easily.

Figure 10:
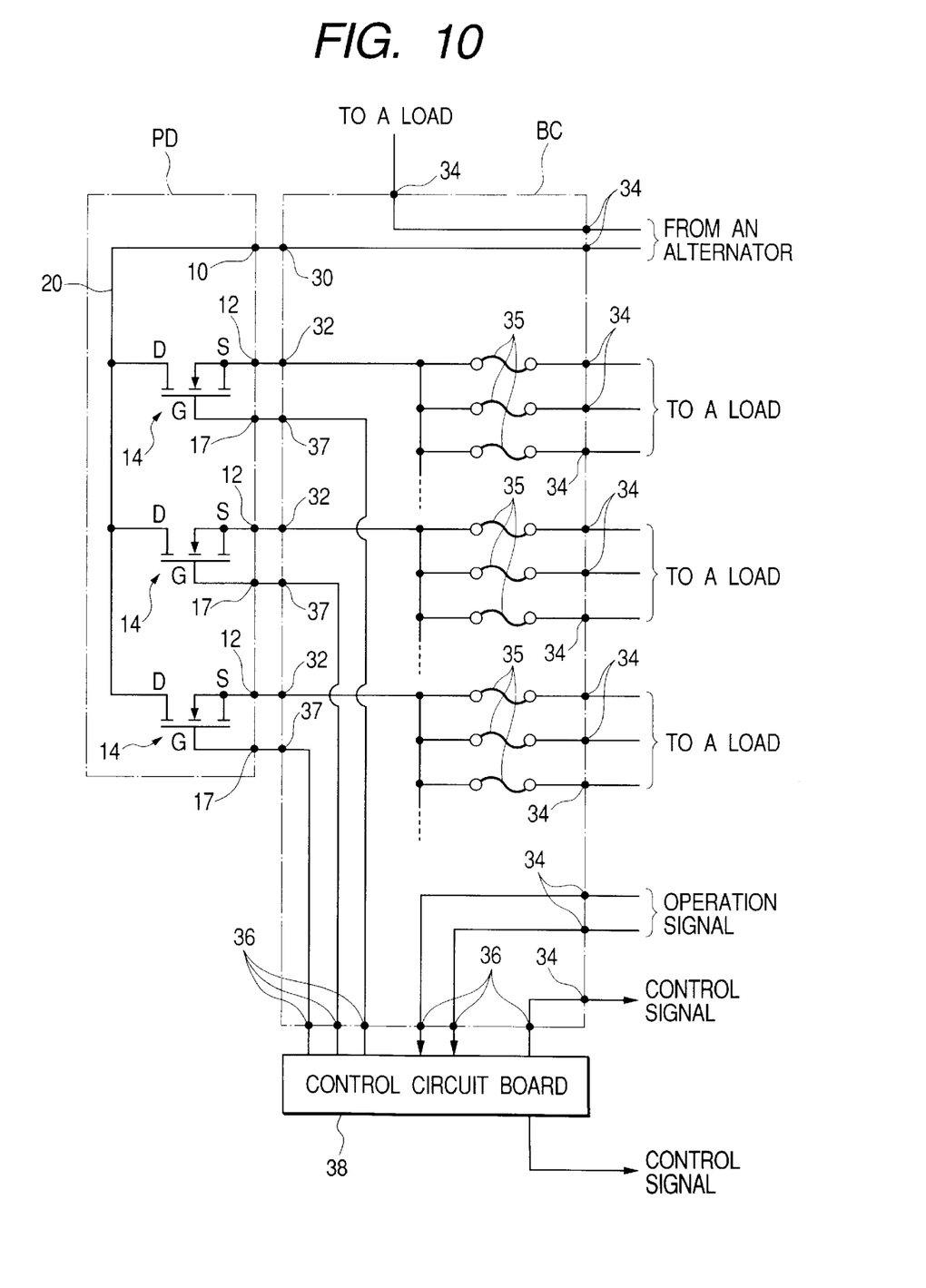
FIG. 10 is a circuit diagram of an electric connection box in which the power distributor is incorporated as a power distribution portion.

The power distributor according to the present invention may be used singly and directly or may be used in the condition that the power distributor is incorporated in an electric connection box having a bus bar board, regardless of the position of the power distributor used in a vehicle. FIG. 10 shows a circuit example of the latter.

In FIG. 10, the power distributor according to the present invention is used as a power distribution portion PD connected to an on-vehicle power supply (a battery in FIG. 10) so that it is incorporated together with a bus bar circuit portion BC constituted by a bus bar board and the control circuit board 38 in an electric connection box.

The configuration of the power distribution portion PD is the same as that shown in FIGS. 1 to 8. That is, the power distribution portion PD has an input terminal portion 10 connected to the battery, a plurality of (three illustrated in FIG. 10) output terminal portions 12, and signal terminal portions 17 of the same number as that of the output terminal portions 12. A semiconductor switching device (a power MOSFET 14 which is illustrated in FIG. 10 and which will be hereinafter simply referred to as "FET") is interposed between each of the output terminal portions 12 and the input terminal portion 10.

The number of the output terminal portions 12 may be set suitably in accordance with the place and kind of subjects of power distribution in the vehicle. In the example shown in FIG. 10, the subjects of power distribution are classified into three groups, namely, IG load (a wiper, a window washer, a heater, or the like), Acc load (a cigar lighter, an audio appliance, accessories, or the like) and +B load (tail lamps, panel lamps, or the like). One FET 14 and one output terminal portion 12 are provided for each group.

The bus bar circuit portion BC is constituted by a bus bar board made from an alternate laminate of bus bar layers each made of a metal plate and electrically insulating layers each made of an electrically insulating plate. An input terminal connection bus bar 30 connected to the input terminal portion 10 of the power distribution portion PD, output terminal connection bus bars 32 connected to the output terminal portions 12 and signal terminal connection bus bars 37 connected to the signal terminal portions 17 are provided in the board circumferential edge portion of the bus bar board. External connection tabs 34 and control circuit board connection tabs 36 protruded out are formed in suitable places of the bus bar board. The external connection tabs 34 are connected to circuits (such as an alternator and an on-vehicle electric load) outside the electric connection box. The control circuit board connection tabs 36 are connected to the control circuit board 38.

Incidentally, specific means for connecting each of the bus bars 30, 32 and 37 to corresponding one of the terminal portions 10, 12 and 17 of the power distribution portion PD is not particularly limited. For example, these bus bars and terminal portions may be lap-welded with each other directly or may be electrically connected to each other through a suitable wiring material.

Further, fuse portions 35 constituted by fuse blocks may be incorporated in intermediate circuit portions of the bus bar circuit portion BC.

The circuit connection performed by the bus bar circuit portion BC is as follows.

(1) The input terminal portion 10 of the power distribution portion PD and other battery-direct-connected on-vehicle loads are connected to the on-vehicle battery (see the upper portion of FIG. 10).

(2) The output terminal portions 12 of the power distribution portion PD are connected correspondingly to on-vehicle loads through the fuse portions 35.

(3) The signal terminal portions 17 of the power distribution portion PD, external circuits sending operation signals to the control circuit board 38 and external circuits receiving control signals from the control circuit board 38 are connected to the control circuit board 38.

A control circuit incorporated in the control circuit board 38 sends a control signal to an on-vehicle electronic control unit (such as a door control unit or a lamp control unit) directly or through the bus bar circuit portion BC on the basis of the operation signal inputted through the bus bar circuit portion BC to thereby control the on-vehicle electronic control unit.

In addition to the aforementioned control circuit, a control circuit for controlling ON-OFF switching of each FET 14 is incorporated in the control circuit board 38. This control circuit sends a control signal to a gate terminal (current conduction control terminal) of each FET 14 through the bus bar circuit portion BC on the basis of the operation signal inputted through the bus bar circuit portion BC to thereby control the ON-OFF switching of drain-source current conduction of the FET 14.

In the aforementioned electric connection box, the demand for reduction in size and thickness of the power distribution portion PD becomes particularly intensive because it is necessary to incorporate both the power distribution portion PD and the bus bar board BC in the housing. The power distributor as shown in FIGS. 1 to 8 can satisfy the demand sufficiently.

Further, in the case where the power distributor is used independently, it is a matter of course that the installation space of the power distributor can be reduced greatly by the small-size and thin structure of the power distributor.

For example, the present invention can take the following embodiments as other embodiments.

Besides the FETs, any kind of semiconductor devices having switching functions such as other transistors (for example, IGBTs or general bipolar transistors), thyristors (for example, GTOs), and so on, can be applied to the semiconductor switching devices used in the present invention in accordance with the specification. The semiconductor switching devices may be provided in the form of a package device or may be mounted directly, for example, in the form of semiconductor chips. The mode of connection between each semiconductor switching device and a corresponding terminal is not particularly limited. For example, wire bonding may be used to connect each semiconductor switching device and a corresponding terminal in a suitable place.

Although the aforementioned embodiment has shown the case where the input terminal portion 10, the output terminal portions 12, the signal terminal portions 17 and the earth terminal portions 18 are provided as terminal portions, the earth terminal portions 18 may be omitted in accordance with the semiconductor switching devices when, for example, semiconductor switching devices having no earth terminals are used. Further, the signal terminal portions 17 may be omitted and other conductors may be used so that the control terminals of the semiconductor switching devices are connected to the control circuit by the conductors. That is, the effect of the present invention can be achieved if the power distributor has at least the input terminal portion and the output terminal portions as terminal portions.

In the present invention, for example, the input terminal portion 10 may be protruded in a direction opposite to the direction of protrusion of the output terminal portions 12 so that external circuits are directly connected to the input terminal portion 10. The configuration of the input terminal portion 10 protruded in the same direction as that of protrusion of the output terminal portions 12, however, makes it possible to reduce the required area when the bus bar aggregation B is punched out from a metal plate, and makes it possible to perform the connection of all the external circuits to the power distributor from one side, compared with the configuration of the input terminal portion 10 protruded in a direction opposite to the direction of protrusion of the output terminal portions 12. Hence, in former configuration, connecting work efficiency is improved.

In the present invention, the semiconductor switching devices need not be completely buried in the mold housing. For example, the semiconductor switching devices may be partially exposed from the housing. In short, the effect of the present invention can be achieved if the housing is molded so that the connection portion between each semiconductor switching device and the device mount portion can be held by the housing.

As described above, the power distributor according to the present invention is obtained by molding a housing around a device-containing bus bar aggregation having semiconductor switching devices mounted on the bus bar aggregation. Hence, there is an effect that good power distribution in a vehicle can be made by a simple and thin structure. Further, the method of producing the power distributor according to the present invention comprises the steps of: forming a bus bar aggregation; mounting semiconductor devices on the bus bar aggregation; molding a housing around the device-containing bus bar aggregation; and cutting suitable places of the bus bar aggregation after the molding to thereby complete a power distribution circuit. Hence, there is an effect that the power distributor can be produced by simple steps.

What is claimed is:

1. A method of producing a vehicle power distributor which is to be mounted on a vehicle for distributing electric power from a common power supply into a plurality of electric loads and which uses semiconductor switching devices interposed between said power supply and said loads for switching on/off current conduction thereof, forming a bus bar aggregation containing an input terminal portion connected to said power supply, a device mount portion connected to said input terminal portion and having said semiconductor switching devices mounted on said device mount portion in the condition that a power supply side current-conduction terminal of each semiconductor switching device is connected to said device mount portion, and a plurality of output terminal portions to which load side current-conduction terminals of said semiconductor switching devices are connected respectively, said input terminal portion and said outpiut terminal portions extend in a direction approximnately perpendicular to a direction of a length of said device mount portion, and said input terminal portion, said device mount portions and said output terminal portions being integrated with one another;

mounting said semiconductor switching devices on said device mount portion by connecting power supply side current-conduction terminals of said semiconductor switching devices to said device mount portion of said bus bar aggregation and connecting said load side current-conduction terminals of said semiconductor switching devices to said output terminal portions respectively;

molding a housing from an electrically insulating material around the device-containing bus bar aggregation produced by the mounting step so that at least said input terminal portion and said output terminal portions are partially exposed; and cutting joint portions between a plurality of terminal portions inclusive of said input terminal portion and said output terminal portions after the molding step.

2. The method of producing a vehicle power distributor according to claim 1, wherein
the step of forming said bus bar aggregation is constituted by the step of punching out said bus bar aggregation from a single metal plate.

3. The method of producing a vehicle power distributor according to claim 1, further comprising the step of attaching a heat-radiating member to said housing formed by the molding step so that said heat-radiating member is exposed to the outside of said housing in a state in which heat can be transmitted between said heat-radiating member and said device mount portion.

4. The method of producing a vehicle power distributor according to claim 1, wherein a window through which joint portions between said plurality of terminal portions are exposed is formed in said housing in the molding step; and said joint portions are cut off through said window in the cutting step.

5. The method of producing a vehicle power distributor according to claim 2, further comprising the step of attaching a heat-radiating member to said housing formed by the molding step so that said heat-radiating member is exposed to the outside of said housing in a state in which heat can be transmitted between said heat-radiating member and said device mount portion.

6. The method of producing a vehicle power distributor according to claim 2, wherein a window through which joint portions between said plurality of terminal portions are exposed is formed in said housing in the molding step; and said joint portions are cut off through said window in the cutting step.

7. The method of producing a vehicle power distributor according to claim 3, wherein a window through which joint portions between said plurality of terminal portions are exposed is formed in said housing in the molding step; and said joint portions are cut off through said window in the cutting step.

8. A vehicle power distributor which is to be mounted on a vehicle for distributing electric power from a common power supply into a plurality of electric loads and which uses semiconductor switching devices interposed between said power supply and said loads for switching on/off current conduction thereof, said vehicle power distributor comprising:

a bus bar aggregation including;
an input terminal portion connected to said power supply,
a device mount portion connected to said input terminal portion and having said semiconductor switching devices mounted on said device mount portion in the condition that power supply side current-conduction terminals of said semiconductor switching devices are connected to said device mount portion, and
a plurality of output terminal portions to which load side current-conduction terminals of said semiconductor switching devices are connected said input terminal portion and said output terminal portions extend in a direction approxinmately perpendicular to a direction of a length of said device mount portion; and
a housing molded from an electrically insulating material around the device-containing bus bar aggregation so that at least said input terminal portion and said output terminal portions are partially exposed in the condition that said plurality of semiconductor switching devices are mounted on said device mount portion of said bus bar aggregation.

9. The vehicle power distributor according to claim 8, further comprising:
a heat-radiating member attached to said housing so that said heat-radiating member is exposed to the outside of said housing in a state in which heat can be transmitted between said heat-radiating member and said device mount portion.

10. A bus bar aggregation for forming a vehicle power distributor which is to be mounted on a vehicle for distributing electric power from a common power supply into a plurality of electric loads and which uses semiconductor switching devices interposed between said power supply and said loads for switching on/off current conduction thereof, said bus bar aggregation comprising:

an input terminal portion connected to said power supply;
a device mount portion connected to said input terminal portion and having said semiconductor switching devices mounted on said device mount portion in the condition that power supply side current-conduction terminals of said semiconductor switching devices are connected to said device mount portion; and
a plurality of output terminal portions to which load side current-conduction terminals of said semiconductor switching devices are connected, said input tenninal portion and said output terminal portions extend in a direction approximately perpendicular to a direction of a length of said device mount portion, wherein said bus bar aggregation is made from a single metal plate, and said input terminal portion, said device mount portion, and said output terminal portions are integrated with one another.

11. The bus bar aggregation for a power distributor according to claim 10, wherein
said device mount portion extends in a direction of arrangement of said semiconductor switching devices;
said input terminal portion and said output terminal portions are arranged at intervals in a direction approximately parallel with the direction of the length of said device mount portion; and
end portions of said input terminal portion and output terminal portions opposite to said device mount portion are connected to one another by a connection belt which extends approximately in parallel with said device mount portion.

12. The device-containing bus bar aggregation for a power distributor according to claim 11, wherein said plurality of semiconductor switching devices are mounted on said device mount portion; said power supply side current-conduction terminals of said semiconductor switching devices are connected to said device mount portion; and said load side current-conduction terminals of said semiconductor switching devices are connected to said output terminal portions respectively.

13. The device-containing bus bar aggregation for a power distributor according to claim 10, wherein said plurality of semiconductor switching devices are mounted on said device mount portion; said power supply side current-conduction terminals of said semiconductor switching devices are connected to said device mount portion; and said load side current-conduction terminals of said semiconductor switching devices are connected to said output terminal portions respectively.

* * * * *